United States Patent [19]

Watanabe et al.

[11] Patent Number: 5,384,682
[45] Date of Patent: Jan. 24, 1995

[54] ELECTROSTATIC CHUCK

[75] Inventors: Toshiya Watanabe; Tetsuo Kitabayashi, both of Kanagawa, Japan

[73] Assignee: Toto Ltd., Fukuoka, Japan

[21] Appl. No.: 34,076

[22] Filed: Mar. 22, 1993

[51] Int. Cl.⁶ .............................................. H02N 13/00
[52] U.S. Cl. ..................... 361/234; 279/128; 269/8
[58] Field of Search ................ 204/192.32; 361/230, 361/233, 234, 235; 269/DIG. 903, 8; 279/128; 29/829; 156/643

[56] References Cited

U.S. PATENT DOCUMENTS

| | | | |
|---|---|---|---|
| 4,184,188 | 1/1980 | Briglia | 361/234 |
| 5,151,845 | 9/1992 | Watanabe et al. | 361/234 |
| 5,166,856 | 11/1992 | Liporace et al. | 361/233 |

Primary Examiner—Jeffrey A. Gaffin
Assistant Examiner—Peter Ganjoo
Attorney, Agent, or Firm—Irving M. Weiner; Joseph P. Carrier; Pamela S. Burt

[57] ABSTRACT

An electrostatic chuck has a substrate, an insulating layer disposed on the substrate for attracting a workpiece thereto, and an electrode interposed between the substrate and the insulating layer. The insulating layer having a volume resistivity $\rho(\Omega m)$, a dielectric constant $\epsilon_r$, and a thickness d (m), and being spaced from the workpiece which is attracted thereto by a gap having a distance $\delta(m)$. The volume resistivity $\rho$, the dielectric constant $\epsilon_r$, the thickness d, and the distance $\delta$ satisfy the following relationship:

$$1.731 \times 10^{-11} \rho \{\epsilon_r + d/\delta\} < 60.$$

13 Claims, 3 Drawing Sheets

δ : GAP WHEN WORKPIECE W IS ATTRACTED
d : THICKNESS OF INSULATING LAYER $\delta$ : GAP WHEN WORKPIECE W IS ATTRACTED
$d$ : THICKNESS OF INSULATING LAYER

ELECTROSTATIC CHUCK

BACKGROUND OF THE INVENTION

1. Field of the Invention

The present invention relates to an electrostatic chuck for electrostatically attracting and holding a workpiece such as a semiconductor wafer or the like.

2. Description of Relevant Art

One conventional electrostatic chuck plate disclosed in Japanese patent publication No. 60-59104, which corresponds to U.S. Pat. No. 4,480,284, has a dielectric layer formed on an electrode plate for securely holding a workpiece such as a semiconductor wafer thereon under an electric field developed between the electode plate and the semiconductor wafer while the semiconductor wafer is being processed by plastma etching, CVD, ion plating, or the like in a vacuum. When a voltage is applied between the electrode plate and the workpiece, the workpiece is attracted and held on the electrostatic chuck plate under large electrostatic attractive forces. When the voltage applied between the elecrode plate and the workpiece is removed, any electrostatic attractive forces that have been developed are immediately reduced, allowing the workpiece to be easily released from the electrostatic chuck plate.

To increase attractive forces produced by an electrostatic chuck, the dielectric constant of the dielectric layer thereof may be increased as disclosed in Japanese patent publications Nos. 60-59104 and 62-19060, or the thickness of the dielectric layer thereof may be controlled as disclosed in Japanese laid-open patent publication No. 57-64950 corresponding to U.S. Pat. No. 4,384,918, or the volume resistivity of the dielectric layer thereof may be selected in a predetermined range as disclosed in Japanese patent publication No. 61-14660. To facilitate removal of the workpiece from the electrostatic chuck, a helium gas may be introduced between the workpiece and a chuck surface to which the workpiece is attracted as disclosed in Japanese laid-open utility model publication No. 2-120831, or a voltage of opposite polarity to the polarity of the voltage applied to attract the workpiece is applied as disclosed in Japanese patent publication No. 2-63304.

The various conventional schemes for increasing the attractive forces are primarily concerned with the dielectric layer. Therefore, the greater the attractive forces, the greater the residual attractive forces that remain present after the applied voltage is removed. It takes 60 seconds or longer until the residual attractive forces are reduced by 98% or more allowing the workpiece to be easily detached from the conventional electrostatic chuck. Thus, the workpiece cannot immediately be removed after it has been processed while being held by the electrostatic chuck. For easy and immediate removal of the workpiece from the electrostatic chuck, therefore, it is necessary to employ another removal device in addition to the electrostatic chuck or a new removal process in addition to the ordinary process combined with the electrostatic chuck. The additional device or process for easy and immediate workpiece removal however poses problems on its use at low temperatures.

Recent years have seen the problem of contamination of semiconductor wafers with metal, resulting in a reduced semiconductor device yield. One solution has been to deposit a protective film on the attractive surface of an electrostatic chuck for protecting semiconductor wafers against contamination from the electrostatic chuck. Depending on the electric characteristics of such a protective film, the electrostatic chuck may not develop sufficient attractive forces for holding semiconductor wafers.

Japanese laid-open patent publication No. 2-22166, which corresponds to U.S. Pat. No. 5,104,834, assigned to the same assignee of the present application, discloses a dielectric ceramic material for an electrostatic chuck and a method of manufacturing such a dielectric ceramic material.

SUMMARY OF THE INVENTION

It is an object of the present invention to provide an electrostatic chuck whose residual electrostatic forces can be reduced in a short period of time and which has a protective film that does not lower attractive forces produced by the electrostatic chuck.

According to the present invention, there is provided an electrostatic chuck comprising a substrate, an insulating layer disposed on the substrate for attracting a workpiece thereto, and an electrode interposed between the substrate and the insulating layer, the insulating layer having a volume resistivity $\rho(\Omega m)$, a dielectric constant $\epsilon_r$, and a thickness d (m), and being spaced from the workpiece which is attracted thereto by a gap having a distance $\delta(m)$, the volume resistivity $\rho$, the dielectric constant $\epsilon_r$, the thickness d, and the distance $\delta$ satisfying the following relationship:

$$1.731 \times 10^{-11} \rho \{\epsilon_r + d/\delta\} < 60.$$

According to the present invention, there is also provided an electrostatic chuck comprising a substrate, an insulating layer disposed on the substrate for attracting a workpiece thereto, an electrode interposed between the substrate and the insulating layer, and a protective film disposed on the insulating layer, the insulating layer having a volume resistivity $\rho$ and the protective film having a volume resistivity $\rho_t$, the volume resistivities $\rho$, $\rho_t$ satisfying the following relationship:

$$\rho t/\rho > 10^{-1}.$$

According to the present invention, there is further provided an electrostatic chuck comprising a substrate, an insulating layer disposed on the substrate for attracting a workpiece thereto, and an electrode interposed between the substrate and the insulating layer, the insulating layer having a volume resistivity $\rho(\Omega m)$, a dielectric constant $\epsilon_r$, a thickness d (m), and a surface roughness (Rmax)esc (m), and the workpiece having a surface roughness (Rmax)plate (m), the volume resistivity $\rho$, the dielectric constant $\epsilon_r$, the thickness d, and the surface roughnesses (Rmax)esc, (Rmax)plate (m) satisfying the following relationship:

$$1.731 \times 10^{-11} \rho \left\{ \epsilon_r + \frac{2d}{(Rmax)esc + (Rmax)plate} \right\} < 60.$$

The volume resistivity of the insulating layer, the dielectric constant of the insulating layer, the thickness of the insulating layer and the gap between the workpiece and the insulating layer, if any, are selected to be in a certain range to cause the electrostatic force of the electrostatic chuck to decrease in a short period of time at low temperatures as well as normal temperatures.

The electrostatic chuck can produce sufficient electrostatic forces to attract the workpiece if the volume resistivities of the insulating layer and the protective film are in the predetermined range of $\rho_t/\rho > 10^{-1}$.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
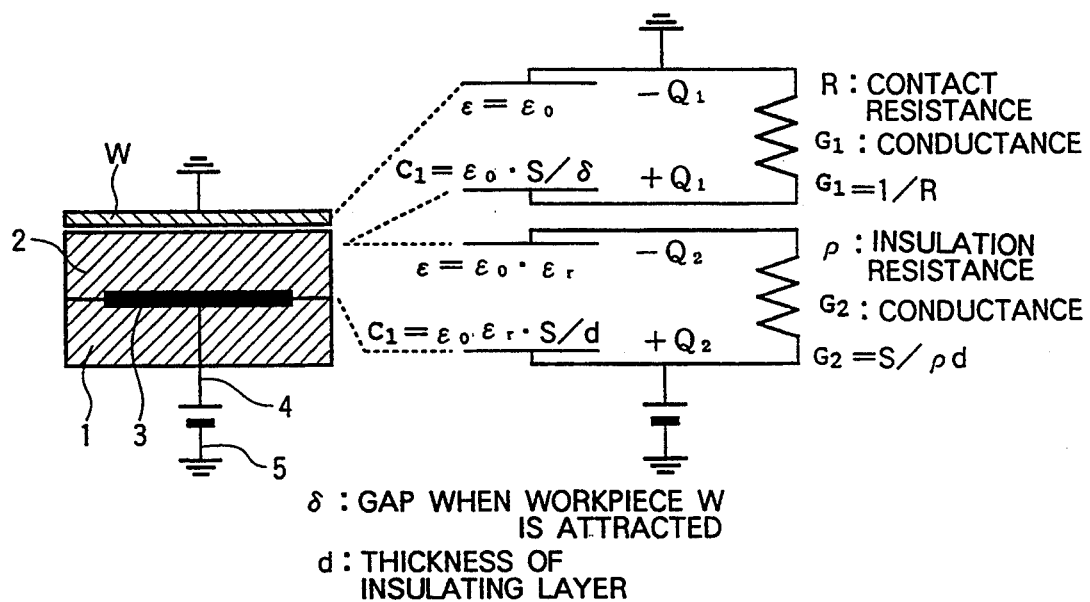
FIG. 1 is a cross-sectional view of an electrostatic chuck according to an embodiment of the present invention, the view also showing an equivalent circuit of the electrostatic chuck.

As shown in FIG. 1, an electrostatic chuck according to an embodiment of the present invention comprises a substrate 1, an insulating layer 2 disposed on the substrate 1, and an electrode 3 sandwiched between the substrate 1 and the insulating layer 2. The electrode 3 is electrically connected to a DC power supply 5 through a lead 4. A workpiece W such as a semiconductor wafer to be electrostatically attracted and held by the electrostatic chuck is electrically connected to ground directly or through a plasma.

The substrate 1 is made of a material such as $Al_2O_3$, $Si_3N_4$, AlN, or SiC. To achieve desired erosion resistance, mechanical strength, and electric properties, the insulating layer 2 is made of a material comprising alumina ($Al_2O_3$) with a transition metal oxide such as titania ($TiO_2$) or chromia ($Cr_2O_3$) added for adjusting the insulation resistance of the insulating layer 2 and an oxide of silicon or an alkaline earth metal added as a sintering assistant. The insulating layer 2 may be of the same material as the substrate 1. Alternatively, the insulating layer 2 may be made of a sintered ceramic material such as $Si_3N_4$, SiC, AlN, $ZrO_2$, $SiO_2 \cdot Al_2O_3$, or BN, or an organic material such as chloroprene rubber or acrylic rubber.

The electrostatic chuck is manufactured as follows: A solvent is added to the material of the substrate 1, and the mixture is kneaded and shaped into a sheet for use as the substrate 1. Similarly, a solvent is added to the material of the insulating layer 2, and the mixture is kneaded and shaped into a sheet for use as the insulating layer 2. Thereafter, a paste-like electrode material such as tungsten (W) is coated on an upper surface of the sheet of the substrate 1 or a lower surface of the sheet of the insulating layer 2. These sheets are then superimposed and baked together.

As shown in FIG. 1, when the semiconductor wafer W is attracted and held by the electrostatic chuck, the gap between the semiconductor wafer W and the insulating layer 2 has a capacitance $C_1$ and a conductance $G_1$, and the insulating layer 2 has a capacitance $C_2$ and a conductance $G_2$. The capacitances $C_1$, $C_2$ and the conductances $G_1$, $G_2$ are expressed as follows:

$$C_1 = \frac{\epsilon_0 \cdot S}{\delta} \qquad C_2 = \frac{\epsilon_0 \cdot \epsilon_r \cdot S}{d} \qquad (1)$$
$$G_1 = \frac{1}{R} \qquad G_2 = \frac{S}{\rho \cdot d}$$

where $\rho$ is the volume resistivity ($\Omega$m) of the insulating layer 2, $\epsilon_0$ the dielectric constant of vacuum, $\epsilon_r$ the dielectric constant of the insulating layer 2, d the thickness (m) of the insulating layer 2, S the surface area (m²) of the semiconductor wafer W, R the contact resistance ($\Omega$) between the semiconductor wafer W and the insulating layer 2, and $\delta$ the distance (m) of the gap between the semiconductor wafer W and the insulating layer 2.

When the voltage applied to the electrostatic chuck is removed to eliminate any potential difference between the semiconductor wafer W and the electrode 3, a residual electrostatic force F that remains present on the electrostatic chuck is given as follows:

$$F = \frac{1}{2\epsilon_0 S^2} \left( V \times \frac{C_1 \cdot G_2 - C_2 \cdot G_1}{G_1 + G_2} \right)^2 \times \left[ \text{EXP}\left( -\frac{2(G_1 + G_2)}{C_1 + C_2} t \right) \right] \qquad (2)$$

where V is the voltage and t is time.

In the equation (2), the rate at which the residual electrostatic force F is reduced is governed by $2(G_1+G_2)/(C_1+C_2)$. A time $t_s$ required for the residual electrostatic force F to be reduced by 98% of a saturated electrostatic force is expressed as follows:

$$t_s = 3.912 \times \frac{C_1 + C_2}{2(G_1 + G_2)} \qquad (3)$$
$$= 1.956 \times \frac{S\rho R \epsilon_0 (d + \epsilon_r \delta)}{2\delta(\rho d + RS)}.$$

If the contact resistance R is sufficiently large, such as if the workpiece W is a silicon wafer, the time $t_s$ is expressed as follows:

$$t_s \approx 1.731 \times 10^{-11} \rho \{\epsilon_r + d/\delta\} \qquad (4)$$

Figure 2:
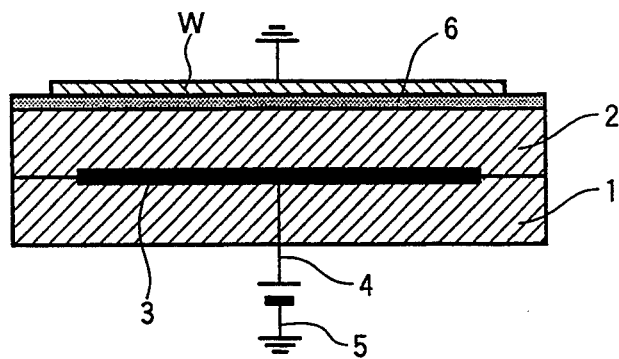
FIG. 2 is a cross-sectional view of an electrostatic chuck according to another embodiment of the present invention.

Additionally, the contact resistance R may be adjusted or controlled using a protective film, as discussed in relation to the embodiment of FIG. 2.

In order for the time $t_s$ of the electrostatic chuck according to the present invention to be shorter than the corresponding time of the conventional electrostatic chucks, the parameters $\rho$, $\epsilon_r$, d, $\delta$ should be selected to satisfy the following inequality:

$$1.731 \times 10^{-11} \rho \{\epsilon_r + d/\delta\} < 60 \qquad (5)$$

The distance of the gap between the workpiece W and the insulating layer 2 may be represented by surface roughness (maximum height). More specifically, if it is assumed that the surface roughness (maximum height) of the insulating layer 2 is indicated by (Rmax)esc (m) and the surface roughness (maximum height) of the workpiece W is indicated by (Rmax)plate (m), then the inequality (5) may be expressed as follows $$1.731 \times 10^{-11} \rho \left( \epsilon_r + \frac{2d}{(Rmax)esc + (Rmax)plate} \right) < 60. \quad (6)$$

The surface roughnesses of the insulating layer 2 and the workpiece W are measured according to JIS(B0601). The surface roughness may further be replaced with a maximum surface undulation, which may be measured according to JIS(0610).

FIG. 2 shows an electrostatic chuck according to another embodiment of the present invention. The electrostatic chuck shown in FIG. 2 differs from the electrostatic chuck shown in FIG. 1 in that a protective film 6 is disposed on the surface of the insulating layer 2 for preventing impurities from being diffused or mixed into the workpiece W from the insulating layer 2. The projective film 6 may be made of a ceramic material containing Si, such as $Si_3N_4$, SiC, $SiO_2$, or the like, or a material of high thermal conductivity such as $Al_2O_3$, AlN, C (diamond), or the like, or a material that is mainly composed of the material of the insulating layer 2 which is highly purified.

A saturated electrostatic force $F_0$ of the electrostatic chuck shown in FIG. 2 sufficiently after elapse of the time required to apply the voltage to the electrostatic chuck is expressed as follows:

$$F_0 = \frac{1}{2\epsilon_0 S^2} \left\{ V \times \frac{C_1 \cdot G_2 - C_2 \cdot G_1}{G_1 + G_2} \right\}^2, \text{ or} \quad (7)$$

$$F_0 = \frac{\epsilon_0}{2\delta^2} \left\{ \frac{\frac{R}{\rho} - \frac{\epsilon_r \delta}{S}}{\frac{R}{\rho} + \frac{d}{S}} \right\}^2 \times V^2.$$

Figure 3:
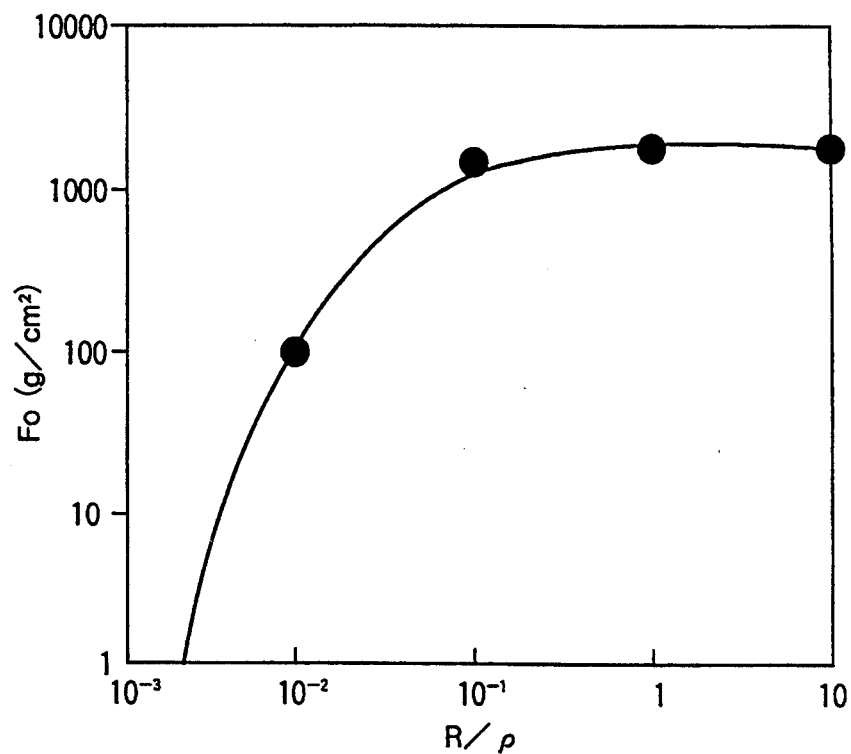
FIG. 3 is a diagram showing the relationship between a saturated electrostatic force and the ratio of a contact resistance to a dielectric layer volume resistivity of the electrostatic chuck shown in FIG. 2.

It can be seen from the equation (7) that the saturated electrostatic force $F_0$ is determined by the ratio $R/\rho$ of the contact resistance R to the volume resistivity $\rho$ of the insulating layer 2. That is, when the contact resistance R is reduced, the voltage divided between the protective film 6 and the workpiece W is reduced, resulting in a reduction in the electric charge stored in the capacitor $C_1$ that is formed across the gap between the insulating layer 2 and the workpiece W. Consequently, if the contact resistance R (the reciprocal of the conductance $G_1$) is small as compared with the volume resistivity $\rho$ of the insulating layer 2, then the saturated electrostatic force $F_0$ is also small, as shown in FIG. 3.

It is appropriate and convenient to control the contact resistance R using the volume resistivity $\rho_t$ of the protective film 6.

Figure 4:
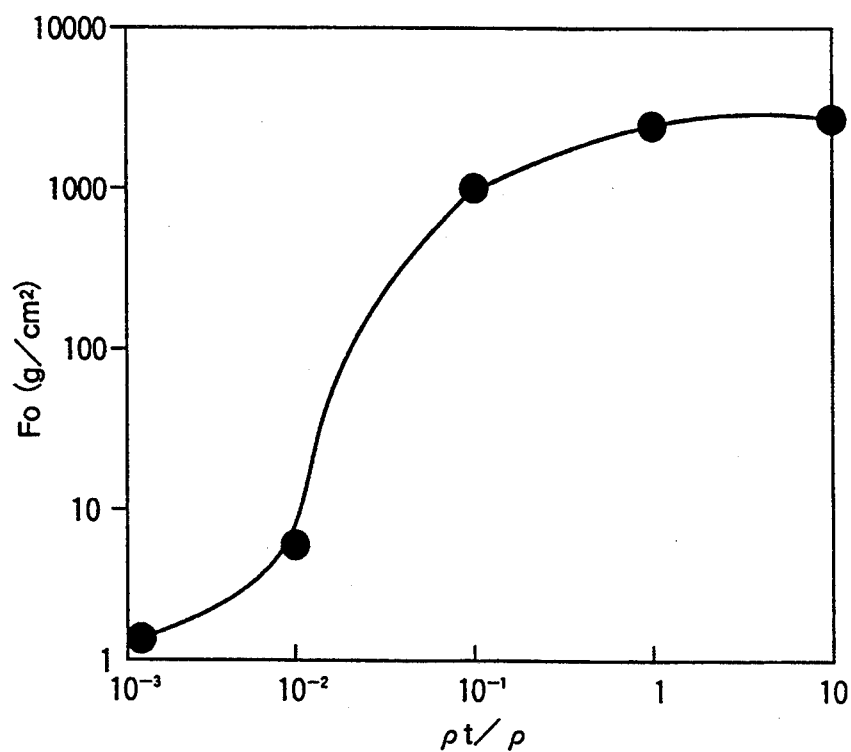
FIG. 4 is a diagram showing the relationship between a saturated electrostatic force and the ratio of a protective film volume resistivity to a dielectric layer volume resistivity of the electrostatic chuck shown in FIG. 2.

FIG. 4 shows the relationship between the saturated electrostatic force $F_0$ and the ratio $\rho_t/\rho$ of the volume resistivity $\rho_t$ of the protective film 6 to the volume resistivity $\rho$ of the insulating layer 2. Study of FIG. 4 indicates that no sufficient saturated electrostatic force for attracting a semiconductor wafer can be generated if the ratio $\rho_t/\rho$ is $10^{-2}$ or less, and that a sufficient saturated electrostatic force can be generated if the ratio $\rho_t/\rho$ is $10^{-1}$ or higher.

Tables 1 through 4 below show calculated and measured times $t_s$ of different samples having different insulating layer volume resistivities $\rho$, different insulating layer thicknesses d, different gaps $\delta$ ($\delta \approx \{(Rmax)esc + (Rmax)plate\}/2$), and different insulating layer materials. It can be understood from Tables 1 through 4 that the calculated and measured times $t_s$ are in good agreement with each other. Therefore, an electrostatic chuck can have a desired time $t_s$ when it is set to a gap distance $\delta$ or surface roughnesses (Rmax) esc, (Rmax) plate of the insulating layer and the workpiece that are calculated according to the equation (5) or (6) based on the volume resistivity of the insulating layer, the dielectric constant of the insulating layer, the thickness of the insulating layer.

TABLE 1

(with different insulating layer volume resistivities)

| Sample | Workpiece plate | $\rho$ ($\Omega$m) | R ($\Omega$) per 7.07 × $10^{-4}$ m$^2$ | d (× $10^{-6}$ m) | Area (× $10^{-4}$ m$^2$) | $\epsilon_r$ | (Rmax) esc (× $10^{-6}$ m) | (Rmax) plate (× $10^{-6}$ m) | $\delta$ (× $10^{-6}$ m) | $t_s$ (sec) (*) | $t_s$ (sec) () | $t_s$ (sec) (*) |
|---|---|---|---|---|---|---|---|---|---|---|---|---|
| 1 | Brass | 7.80 × 10$^7$ | 9.10 × 10$^8$ | 300 | 7.07 | 75 | 4.1 | 0.253 | 2.176 | 0.277 | 0.287 | <3 |
| 2 | Brass | 5.50 × 10$^8$ | 2.10 × 10$^9$ | 300 | 7.07 | 62 | 4.2 | 0.253 | 2.226 | 1.685 | 1.873 | <3 |
| 3 | Brass | 1.27 × 10$^9$ | 2.73 × 10$^9$ | 300 | 7.07 | 51 | 4.43 | 0.253 | 2.341 | 3.288 | 3.937 | <3 |
| 4 | Brass | 6.25 × 10$^9$ | 4.87 × 10$^9$ | 300 | 7.07 | 36.1 | 3.54 | 0.253 | 1.896 | 13.60 | 21.01 | 19 |
| 5 | Brass | 3.39 × 10$^{10}$ | 1.21 × 10$^{10}$ | 300 | 7.07 | 37.7 | 4.584 | 0.253 | 2.418 | 43.36 | 94.91 | 50 |
| 6 | Brass | 1.05 × 10$^{11}$ | 1.10 × 10$^{11}$ | 300 | 7.07 | 25.8 | 4.94 | 0.253 | 2.596 | 182.8 | 256.8 | 160 |
| 7 | Brass | 7.60 × 10$^{11}$ | 5.50 × 10$^{11}$ | 300 | 7.07 | 22 | 4 | 0.253 | 2.126 | 1352. | 2145. | >600 |
| 8 | Si | 7.80 × 10$^7$ | 3.20 × 10$^9$ | 300 | 7.07 | 75 | 4.1 | 1.37 | 2.735 | 0.246 | 0.249 | <3 |
| 9 | Si | 5.50 × 10$^8$ | 4.50 × 10$^9$ | 300 | 7.07 | 62 | 4.2 | 1.37 | 2.785 | 1.536 | 1.615 | <3 |
| 10 | Si | 1.27 × 10$^9$ | 6.00 × 10$^9$ | 300 | 7.07 | 51 | 4.43 | 1.37 | 2.9 | 3.115 | 3.395 | 3 |
| 11 | Si | 6.25 × 10$^9$ | 1.11 × 10$^{10}$ | 300 | 7.07 | 36.1 | 3.54 | 1.37 | 2.455 | 13.82 | 17.12 | 16 |
| 12 | Si | 3.39 × 10$^{10}$ | 4.00 × 10$^{10}$ | 300 | 7.07 | 37.7 | 4.584 | 1.37 | 2.977 | 59.76 | 81.25 | 70 |
| 13 | Si | 1.05 × 10$^{11}$ | 3.36 × 10$^{11}$ | 300 | 7.07 | 25.8 | 4.94 | 1.37 | 3.155 | 194.0 | 219.7 | 150 |
| 14 | Si | 7.60 × 10$^{11}$ | 1.50 × 10$^{12}$ | 300 | 7,07 | 22 | 4 | 1.37 | 2.685 | 1448. | 1759. | >600 |

(*) Calculated according to the equation (3) for 25° C.
(**) Calculated according to the equation (4) for 25° C.
(***) Measured at 25° C.

TABLE 2

(with different insulating layer thicknesses)

| Sample | Work-piece plate | $\rho$ ($\Omega$m) | R ($\Omega$) per $7.07 \times 10^{-4}$ m² | d ($\times 10^{-6}$ m) | Area ($\times 10^{-4}$ m²) | $\epsilon_r$ | (Rmax) esc ($\times 10^{-6}$ m) | (Rmax) plate ($\times 10^{-6}$ m) | $\delta$ ($\times 10^{-6}$ m) | $t_s$ (sec) (*) | $t_s$ (sec) () | $t_s$ (sec) (*) |
|---|---|---|---|---|---|---|---|---|---|---|---|---|
| 15 | Brass | $4.00 \times 10^9$ | $8.00 \times 10^9$ | 2000 | 7.07 | 40 | 3.5 | 0.947 | 2.223 | 26.94 | 65.04 | 55 |
| 16 | Brass | $3.82 \times 10^9$ | $8.00 \times 10^9$ | 1500 | 7.07 | 40 | 3.5 | 0.947 | 2.223 | 23.47 | 47.25 | 31.5 |
| 17 | Brass | $3.70 \times 10^9$ | $7.80 \times 10^9$ | 1000 | 7.07 | 40 | 3.5 | 0.947 | 2.223 | 18.77 | 31.36 | 21.5 |
| 18 | Brass | $3.65 \times 10^9$ | $7.20 \times 10^9$ | 600 | 7.07 | 40 | 3.5 | 0.947 | 2.223 | 13.68 | 19.57 | 8.5 |
| 19 | Brass | $3.20 \times 10^9$ | $7.00 \times 10^9$ | 300 | 7.07 | 40 | 3.5 | 0.947 | 2.223 | 8.115 | 9.689 | 7 |
| 20 | Brass | $2.60 \times 10^9$ | $6.80 \times 10^9$ | 100 | 7.07 | 40 | 3.5 | 0.947 | 2.223 | 3.628 | 3.824 | 5 |
| 21 | Si | $4.00 \times 10^9$ | $9.00 \times 10^9$ | 2000 | 7.07 | 40 | 3.5 | 1.37 | 2.435 | 26.42 | 59.04 | 35 |
| 22 | Si | $3.82 \times 10^9$ | $8.60 \times 10^9$ | 1500 | 7.07 | 40 | 3.5 | 1.37 | 2.435 | 22.33 | 43.37 | 30 |
| 23 | Si | $3.70 \times 10^9$ | $8.33 \times 10^9$ | 1000 | 7.07 | 40 | 3.5 | 1.37 | 2.435 | 17.72 | 28.86 | 18 |
| 24 | Si | $3.65 \times 10^9$ | $8.21 \times 10^9$ | 600 | 7.07 | 40 | 3.5 | 1.37 | 2.435 | 13.14 | 18.09 | 7 |
| 25 | Si | $3.20 \times 10^9$ | $7.20 \times 10^9$ | 300 | 7.07 | 40 | 3.5 | 1.37 | 2.435 | 7.606 | 9.040 | 6 |
| 26 | Si | $2.60 \times 10^9$ | $5.85 \times 10^9$ | 100 | 7.07 | 40 | 3.5 | 1.37 | 2.435 | 3.432 | 3.648 | 5 |

(*) Calculated according to the equation (3) for 25° C.
(**) Calculated according to the equation (4) for 25° C.
(***) Measured at 25° C.

TABLE 3

(with different gaps)

| Sample | Work-piece plate | $\rho$ ($\Omega$m) | R ($\Omega$) per $7.07 \times 10^{-4}$ m² | d ($\times 10^{-6}$ m) | Area ($\times 10^{-4}$ m²) | $\epsilon_r$ | (Rmax) esc ($\times 10^{-6}$ m) | (Rmax) plate ($\times 10^{-6}$ m) | $\delta$ ($\times 10^{-6}$ m) | $t_s$ (sec) (*) | $t_s$ (sec) () | $t_s$ (sec) (*) |
|---|---|---|---|---|---|---|---|---|---|---|---|---|
| 27 | Brass | $6.25 \times 10^9$ | $4.76 \times 10^{10}$ | 300 | 7.07 | 36.1 | 11.6 | 0.253 | 5.926 | 8.886 | 9.382 | 6 |
| 28 | Brass | $6.25 \times 10^9$ | $7.82 \times 10^{10}$ | 300 | 7.07 | 36.1 | 11.6 | 0.947 | 6.273 | 8.781 | 9.079 | 6 |
| 29 | Brass | $6.25 \times 10^9$ | $8.02 \times 10^{10}$ | 300 | 7.07 | 36.1 | 11.6 | 4.5 | 8.05 | 7.683 | 7.937 | 7 |
| 30 | Brass | $6.25 \times 10^9$ | $1.03 \times 10^{11}$ | 300 | 7.07 | 36.1 | 11.6 | 9.82 | 10.71 | 6.761 | 6.936 | 5 |
| 31 | Brass | $6.25 \times 10^9$ | $4.87 \times 10^9$ | 300 | 7.07 | 36.1 | 3.54 | 0.253 | 1.896 | 13.60 | 21.01 | 19 |
| 32 | Brass | $6.25 \times 10^9$ | $1.00 \times 10^{10}$ | 300 | 7.07 | 36.1 | 3.54 | 0.947 | 2.243 | 14.52 | 18.37 | 12 |
| 33 | Brass | $6.25 \times 10^9$ | $2.00 \times 10^{10}$ | 300 | 7,07 | 36.1 | 3.54 | 4.5 | 4.02 | 10.57 | 11.97 | 7 |
| 34 | Brass | $6.25 \times 10^9$ | $4.00 \times 10^{10}$ | 300 | 7.07 | 36.1 | 3.54 | 9.82 | 6.68 | 8.219 | 8.764 | 6 |
| 35 | Brass | $6.25 \times 10^9$ | $1.75 \times 10^9$ | 300 | 7.07 | 36.1 | 2.02 | 0.253 | 1.136 | 12.90 | 32.46 | 20 |
| 36 | Brass | $6.25 \times 10^9$ | $4.37 \times 10^9$ | 300 | 7.07 | 36.1 | 2.02 | 0.947 | 1.483 | 16.04 | 25.78 | 20 |
| 37 | Brass | $6.25 \times 10^9$ | $1.32 \times 10^{10}$ | 300 | 7.07 | 36.1 | 2.02 | 4.5 | 3.26 | 11.53 | 13.86 | 10 |
| 38 | Brass | $6.25 \times 10^9$ | $3.14 \times 10^{10}$ | 300 | 7.07 | 36.1 | 2.02 | 9.82 | 5.92 | 8.657 | 9.388 | 8 |
| 39 | Si | $6.25 \times 10^9$ | $7.66 \times 10^{10}$ | 300 | 7.07 | 36.1 | 11.6 | 0.08 | 5.84 | 9.146 | 9.463 | 10 |
| 40 | Si | $6.25 \times 10^9$ | $7.75 \times 10^{10}$ | 300 | 7.07 | 36.1 | 11.6 | 1.37 | 6.485 | 8.615 | 8.910 | 10 |
| 41 | Si | $6.25 \times 10^9$ | $7.36 \times 10^9$ | 300 | 7.07 | 36.1 | 3.54 | 0.08 | 1.81 | 16.05 | 21.83 | 20 |
| 42 | Si | $6.25 \times 10^9$ | $1.11 \times 10^{10}$ | 300 | 7.07 | 36.1 | 3.54 | 1.37 | 2.455 | 13.82 | 17.12 | 16 |
| 43 | Si | $6.25 \times 10^9$ | $1.36 \times 10^9$ | 300 | 7.07 | 36.1 | 2.02 | 0.08 | 1.05 | 11.82 | 34.81 | 30 |
| 44 | Si | $6.25 \times 10^9$ | $2.58 \times 10^9$ | 300 | 7.07 | 36.1 | 2.02 | 1.37 | 1.695 | 11.35 | 23.05 | 20 |

(*) Calculated according to the equation (3) for 25° C.
(**) Calculated according to the equation (4) for 25° C.
(***) Measured at 25° C.

TABLE 4

(with different insulating layer materials)

| Sample | Insulating layer materials | $\rho$ ($\Omega$m) | d ($\times 10^{-6}$ m) | Area ($\times 10^{-4}$ m²) | $\epsilon_r$ | (Rmax) esc ($\times 10^{-6}$ m) | (Rmax) plate ($\times 10^{-6}$ m) | $\delta$ ($\times 10^{-6}$ m) | $t_s$ (sec) () | $t_s$ (sec) (*) |
|---|---|---|---|---|---|---|---|---|---|---|
| 45 | 96% Al$_2$O$_3$ | $1.00 \times 10^{13}$ | 300 | 7.07 | 10 | 5 | 1.37 | 3.185 | 18035 | >600 |
| 46 | Porcelain of SiO | $6.00 \times 10^7$ | 300 | 7.07 | 40 | 5 | 1.37 | 3.185 | 0.139 | <3 |
| 47 | Porcelain of Si$_3$N$_4$ | $1.00 \times 10^{12}$ | 300 | 7.07 | 4 | 5 | 1.37 | 3.185 | 1699. | >600 |
| 48 | AlN | $1.00 \times 10^{11}$ | 300 | 7.07 | 9 | 5 | 1.37 | 3.185 | 178.6 | 150 |
| 49 | Porcelain of ZrO$_2$ | $2.70 \times 10^8$ | 300 | 7.07 | 12 | 5 | 1.37 | 3.185 | 0.496 | <3 |
| 50 | Mullite porcelain | $1.00 \times 10^{10}$ | 300 | 7.07 | 6 | 5 | 1.37 | 3.185 | 17.34 | 20 |
| 51 | BN | $1.00 \times 10^{12}$ | 300 | 7.07 | 4 | 5 | 1.37 | 3.185 | 1699. | >600 |
| 52 | Chloroprene rubber | $1.00 \times 10^8$ | 300 | 7.07 | 80 | 5 | 1.37 | 3.185 | 0.301 | <3 |
| 53 | Acrylic rubber | $1.00 \times 10^6$ | 300 | 7.07 | 50 | 5 | 1.37 | 3.185 | 0.002 | <3 |

(**) Calculated according to the equation (4) for 25° C.
(***) Measured at 25° C.

With the protective film 6 on the surface of the insulating layer 2, the electrostatic chuck can produce sufficient electrostatic forces and prevent impurities from being mixed into the workpiece W from the insulating layer 2 if the volume sensitivity $\rho_t$ of the protective film 6 and the volume sensitivity $\rho$ of the insulating layer 2 satisfy the relationship of $\rho_t/\rho \geq 10^{-1}$.

If it is difficult to measure the volume sensitivity $\rho_t$ of the protective film 6, then the surface resistivity $\rho_s$ of the protective film 6 may be measured and used as it is almost the same as the volume sensitivity $\rho_t$.

Figure 5:
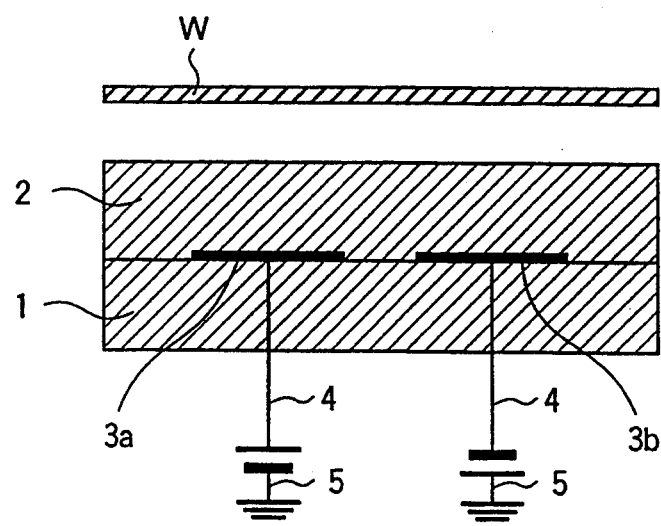
FIG. 5(a) is a cross-sectional view of an electrostatic chuck according to still another embodiment of the present invention.
FIG. 5(b) is a circuit diagram of an equivalent circuit of the electrostatic chuck shown in FIG. 5(a).
Figure 5:
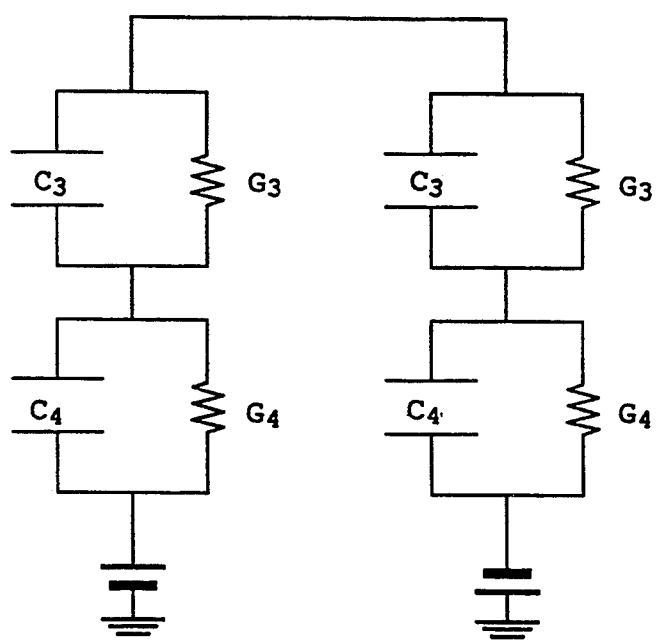

FIG. 5(a) shows an electrostatic chuck according to still another embodiment of the present invention. The electrostatic chuck shown in FIG. 5(a) has two spaced electrodes 3a, 3b interposed between the substrate 1 and the insulating layer 2 and connected respectively to DC power supplies 5 through respective leads 4. FIG. 5(b) shows an equivalent circuit of the electrostatic chuck illustrated in FIG. 5(a), the equivalent circuit including capacitances $C_3$, $C_4$ and conductances $G_3$, $G_4$.

As described above in relation to the embodiments of FIGS. 1 and 2, the volume resistivity of the insulating layer, the dielectric constant of the insulating layer, the thickness of the insulating layer, the gap between the workpiece and the insulating layer, and the dielectric constant of the protective film, if any, are selected to be in a certain range to cause the electrostatic force of the electrostatic chuck to decrease in a short period of time at low temperatures such as of 0° C. or lower as well as normal temperatures such as of 25° C. In a manner similar to the embodiment of FIG. 2, and a protective film could be interposed between the insulating layer 2 and the workpiece W.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. An electrostatic chuck comprising a substrate, an insulating layer disposed on said substrate for attracting a workpiece thereto, and an electrode interposed between said substrate and said insulating layer, said insulating layer having a volume resistivity $\rho(\Omega m)$, a dielectric constant $\epsilon_r$ at a normal temperature of usage of the electrostatic chuck, and a thickness d (m), and being spaced from the workpiece which is attracted thereto by a gap having a distance $\delta(m)$, said volume resistivity $\rho$, said dielectric constant $\epsilon_r$, said thickness d, and said distance $\delta$ satisfying the following relationship:

$$1.731 \times 10^{-11} \rho \{\epsilon_r + d/\delta\} < 60$$

so that a residual electrostatic force of the electrostatic chuck on a workpiece will be rapidly reduced at said normal temperature of usage.

2. An electrostatic chuck according to claim 1, wherein said insulating layer is made of a sintered ceramic material comprising alumina, titania or chromia, and a silicon oxide or an oxide of alkaline earth metal.

3. An electrostatic chuck according to claim 1, wherein said insulating layer is made of a sintered ceramic material comprising $Si_3N_4$ SiC, AlN, $ZrO_2$, $SiO_2$ $.Al_2O_3$, or BN.

4. An electrostatic chuck according to claim 1, wherein said insulating layer is made of an organic rubber.

5. An electrostatic chuck according to claim 4, wherein said organic rubber includes chloroprene rubber or acrylic rubber.

6. An electrostatic chuck according to claim 1, including a protective film disposed on said insulating layer.

7. An electrostatic chuck according to claim 1, wherein said electrostatic chuck is adapted to attract a silicon workpiece thereto.

8. An electrostatic chuck comprising a substrate, an insulating layer disposed on said substrate for attracting a workpiece thereto, an electrode interposed between said substrate and said insulating layer, and a protective film disposed on said insulating layer, said insulating layer having a volume resistivity $\rho$ and said protective film having a volume resistivity $\rho_t$, said volume resistivities $\rho$, $\rho_t$ satisfying the following relationship:

$$\rho_t/\rho > 10^{-1}$$

so that sufficient electrostatic forces may be generated by the electrostatic chuck to securely attract a workpiece thereto.

9. An electrostatic chuck according to claim 8, wherein said protective film is made of a ceramic material comprising $Si_3N_4$, SiC, $SiO_2$, or the like.

10. An electrostatic chuck according to claim 8, wherein said protective film is made of a material of high thermal conductivity selected from a group comprising $Al_2O_3$, AlN, and C (diamond).

11. An electrostatic chuck according to claim 8, wherein said protective film is made of a material that is mainly composed of the material of said insulating layer which is highly purified.

12. An electrostatic chuck comprising a substrate, an insulating layer disposed on said substrate for attracting a workpiece thereto, and an electrode interposed between said substrate and said insulating layer, said insulating layer having a volume resistivity $\rho(\Omega m)$, a dielectric constant $\epsilon_r$, a thickness d (m), and a surface roughness (Rmax)esc (m), and the workpiece having a surface roughness (Rmax)plate (m), said volume resistivity $\rho$, said dielectric constant $\epsilon_r$, said thickness d, and said surface roughnesses (Rmax)esc, (Rmax)plate (m) satisfying the following relationship:

$$1.731 \times 10^{-11} \rho \left( \epsilon_r + \frac{2d}{(Rmax)esc + (Rmax)plate} \right) < 60$$

so that a residual electrostatic force of the electrostatic chuck on a workpiece will be rapidly reduced.

13. An electrostatic chuck according to claim 9, including a protective film disposed on said insulating layer.

* * * * *

UNITED STATES PATENT AND TRADEMARK OFFICE
CERTIFICATE OF CORRECTION

PATENT NO. : 5,384,682
DATED : January 24, 1995
INVENTOR(S) : Watanabe et al.

It is certified that error appears in the above-indentified patent and that said Letters Patent is hereby corrected as shown below:

Column 2, line 44, change ">" to --$\geq$--.

Column 3, line 6, change ">" to --$\geq$--.

Column 4, lines 49 & 50, change "=" to --$\approx$--.

Column 6, line 29, change "$\approx$" to --=--.

Column 8, in Table 2, under the heading $t_s$ (sec) (**), line 7, change "59.04" to --59.64--.

Column 10, line 1 (Claim 3, line 3), insert a comma after "$N_4$";
Column 10, line 24 (Claim 8, line 9), change ">" to --$\geq$--.

Signed and Sealed this

Twenty-first Day of March, 1995

Attest:

BRUCE LEHMAN

*Attesting Officer*  *Commissioner of Patents and Trademarks*